United States Patent [19]

Beucherie

[11] 4,050,408
[45] Sept. 27, 1977

[54] APPARATUS FOR DEPOSITING THIN LAYERS OF MATERIALS BY REACTIVE SPRAYING IN A HIGH-FREQUENCY INDUCTIVE PLASMA

[75] Inventor: Pierre Beucherie, Biandronno (Varese), Italy

[73] Assignee: European Atomic Energy Community (EURATOM), Kirchberg, Luxembourg

[21] Appl. No.: 633,263

[22] Filed: Nov. 19, 1975

[30] Foreign Application Priority Data

Nov. 22, 1974   Luxembourg ............................ 71343

[51] Int. Cl.$^2$ ........................ C23C 13/12; B23K 5/00
[52] U.S. Cl. .................................. 118/49.1; 219/121 P
[58] Field of Search ................. 118/49, 49.1, 50, 50.1, 118/300, 620, 623, 629; 313/362, 363, 359, 161, 231.3; 204/192 IP; 219/121 P

[56] References Cited

U.S. PATENT DOCUMENTS

| | | | |
|---|---|---|---|
| 3,010,009 | 11/1961 | Ducati | 219/121 P |
| 3,247,014 | 4/1966 | Goldberger et al. | 219/121 P |
| 3,690,291 | 9/1972 | Judd et al. | 118/49.1 |
| 3,710,070 | 1/1973 | Hirt et al. | 219/121 P |
| 3,756,193 | 9/1973 | Carmichael et al. | 118/49.1 |
| 3,839,618 | 10/1974 | Muehlberger | 219/121 P |
| 4,006,340 | 2/1977 | Gorinas | 219/121 P |

*Primary Examiner*—Louis K. Rimrodt
*Attorney, Agent, or Firm*—Stevens, Davis, Miller & Mosher

[57] ABSTRACT

A method and apparatus for depositing thin layers of insulating or slightly conductive materials involves reactive spraying through high-frequency inductive plasma. The conductive component of the material to be deposited is sprayed in a first chamber through which an ionizable inert gas travels, the sprayed particles then passing through a second chamber in which a substrate is placed and to which a reactive gas is supplied.

Insulating and weakly inductive materials such as oxides, carbide and nitrides may be deposited at a rate substantially comparable with the rate for conductive materials to obtain high quality uniform deposits.

9 Claims, 5 Drawing Figures

APPARATUS FOR DEPOSITING THIN LAYERS OF MATERIALS BY REACTIVE SPRAYING IN A HIGH-FREQUENCY INDUCTIVE PLASMA

BACKGROUND OF THE INVENTION

1. Field of the Invention

The invention relates to a method and apparatus for depositing thin layers of insulating or slightly conductive materials by reactive spraying through a high-frequency inductive plasma.

The invention relates to a method wherein deposition is produced by spraying the conductive component of the material to be deposited, which comprises the means for applying a high-frequency electromagnetic field, owing to the presence of a gas comprising a reactive gas and an inert gas which can be ionized by the electromagnetic field.

The invention relates to an apparatus comprising a vessel connected to a vacuum generation system containing means which are adapted to produce a high-frequency electromagnetic field and which comprise a material which can be sprayed by the field, at least one surface serving as a substrate for thin layer deposition, and means for injecting a gas comprising a reactive gas and an inert gas ionizable by the field into the vessel near the means for applying the electromagnetic field.

2. Description of the Prior Art

As is well known, various methods such as evaporation, cathode spraying by high-frequency inductive plasma have been used for producing thin layers of materials comprising a number of components, more particularly insulating or slightly conductive materials such as oxides, nitrides or carbides.

In the evaporation method, the insulating components have a low vapour pressure and a high melting point and can be evaporated only by using sources of intense heat such as electron bombardment or an electric arc, in order to form the layers at a sufficient speed. Another disadvantage is that the component to be deposited may also become dissociated owing to the high temperature and the negative pressure.

Another disadvantage of depositing insulating materials by cathode spraying is that the layers are formed very slowly, since a space charge occurs on the cathode and prevents any d.c. spraying occurring; even if radio-frequency is used, the spray cannot be maintained except by greatly reduucing the rate of spraying.

In the known method of spraying by a high-frequency inductive plasma, the material to be sprayed has to be in coil form. The need to convert the insulating material into a coiled wire is difficult and frequently impossible to overcome in the case of fragile insulating materials having low ductility. Furthermore, the coil must be conductive at radio-frequency, i.e. a coil made of conductive material must be coated with the insulating material to be sprayed.

This increases the difficulty of manufacture, with a considerable increase in cost. Furthermore, in the case of a coil having an insulating surface and in the substantially similar case of cathode spraying of insulating materials, the rate of layer formation is limited owing to the considerable decrease in the rate of spraying.

Finally, the same method of spraying by high-frequency inductive plasma has been used, i.e. a conductive material, e.g. a metal, is sprayed and reacted with a suitable ionizing gas for producing the desired insulating layer. The gas may be both ionizable and reactive, or may be a mixture of a reactive gas and an easily ionizable carrier gas. In this method, particles are sprayed as a result of impacts between the ionized gas and the coil material and react with the reactive gas to form a compound of the material, e.g. an oxide, nitride, carbide, sulphide, etc.

However, in such a method the surface layers of the coil are themselves in direct contact with the reactive gas and react with the gas and form the desired insulating compound, thus producing a surface insulating layer on the turns of the coil and greatly limiting the spraying speed.

Furthermore space charges occur between the turns and produce small electric arcs which abruptly destroy the insulating layer formed. The arcs abruptly evaporate and spray large drops of coil material which, before they can combine, are deposited on the substrate and impair the quality of the deposit.

The invention relates to a method which comprises the reactive spraying of a mixed gas by a high-frequency inductive plasma so that insulating materials may be deposited at a rate substantially comparable with the rate for conductive materials to obtain high-quality uniform deposits.

SUMMARY OF THE INVENTION

According to the present invention there is provided a method of depositing thin layers by reactive spraying by a high-frequency inductive plasma, wherein the deposit is produced by spraying the conductive-material to be deposited, which forms the means for applying a high-frequency electromagnetic field owing to the presence of a gas comprising a reactive gas and an inert gas which can be ionized by the electromagnetic field, and in which method the conductive-material component is sprayed by the ionizable inert gas in a first environment through which the gas travels, after which the sprayed particles of the component, during their journey between the substrate to be coated and the means for applying an electromagnetic field, travel through a second environment in which the substrate is placed and through which the reactive gas travels.

Consequently, the method comprises two phases, the first comprising spraying the conductive material from the means for applying an electromagnetic field (e.g. a coil) in the presence of the inert ionizable gas only, and the second phase comprising the action of the reactive gas and occurring exclusively on the sprayed particles, the field-applying means being completely sheltered from the action of the reactive gas.

Since the reactive gas is prevented from slowing down the spraying by forming an insulating surface layer directly on the means for applying the electromagnetic field (e.g. the turns of the coil), spraying can continue freely without being slowed up; consequently insulating materials can be deposited at substantially the same rates as metallic materials.

The reactive gas is preferably introduced into the environment containing the substrate at a rate adjusted according to the desired stoichiometry for the deposited compound.

The reactive gas may be introduced into the environment containing the substrate by varying the flow rate.

Furthermore, the reactive gas may be introduced into the environment containing the substrate at an intermittent flow rate.

In one aspect of the invention the gas introduced into the environment containing the ionizable substrate comprises at least two different reactive gases which are successively injected in dependence on the mixed compounds which are to be alternately deposited.

According to a further aspect of the present invention there is provided an apparatus depositing thin layers by reactive-spraying a high-frequency inductive plasma comprising a sealing-tight vessel connected to a vacuum generation system containing means which are adapted to produce a high-frequency electromagnetic field and comprise a material which can be sprayed by the field, at least one surface serving as a substrate for the thin layer deposition and means for injecting gas into the vessel near the means applying the electromagnetic field, the gas comprising a reactive gas and an inert gas which can be ionized by the electromagnetic field, the vessel comprising partition means dividing it into a first chamber which contains the means applying the electromagnetic field and is connected to the means supplying an ionizable inert gas and at least a second chamber which contains the substrate or substrates and is connected to the means for supplying reactive gas, the partition means being formed with an aperture which connects the chambers and is disposed on the straight path between the substrates and the means for applying the electromagnetic field, the vessel being provided with connecting ducts to the vacuum generation system, the ducts being so disposed with respect to the chambers that the reactive gas cannot flow into the first chamber.

The partition means may comprise a wall disposed between the substrate or substrates and the means for applying the electromagnetic field.

Alternatively the partition means may comprise two walls which together bound the chamber containing the means for applying the electromagnetic field. Alternatively, the partition means may comprise a cylindrical wall enclosing the means for applying the electromagnetic field.

The communication aperture may be at least one orifice, or alternatively, the communication aperture may be a slot round the entire perimeter of the cylindrical wall.

In one aspect, the apparatus comprises an intermediate chamber between the chamber containing the means for applying the electromagnetic field and the chamber containing the substrate or substrates, the intermediate chamber being supplied with a different reactive gas from the chamber or chambers containing the substrate, or with the same gas but in different proportions.

Preferably only the chamber or chambers containing the substrates are provided with connecting ducts to the vacuum generation system.

Each chamber of the vessel may be connected to the vacuum generation system by an individual connecting duct.

BRIEF DESCRIPTION OF THE DRAWINGS

In FIG. 1, a vessel 1 for operation at reduced pressure ($10^{-1}$ to $10^{-3}$ mm Hg for example) is connected by a connecting duct 2 to a vacuum generation system (not shown). A coil 3 comprises the means for applying the electromagnetic field and is made of the material to be sprayed (which is also one constituent of the material to be deposited). A substrate 4 for the desired thin layer is disposed in a second chamber. A duct 5 supplies an ionizable inert gas, such as argon and ejects the gas near coil 3. A duct 6 supplies a reactive gas such as O, N or CO.

The vessel 1 is divided by a wall 7 into two separate chambers 8, 9 interconnected by orifices such as an orifice 10 formed in a wall 7.

Figure 1:
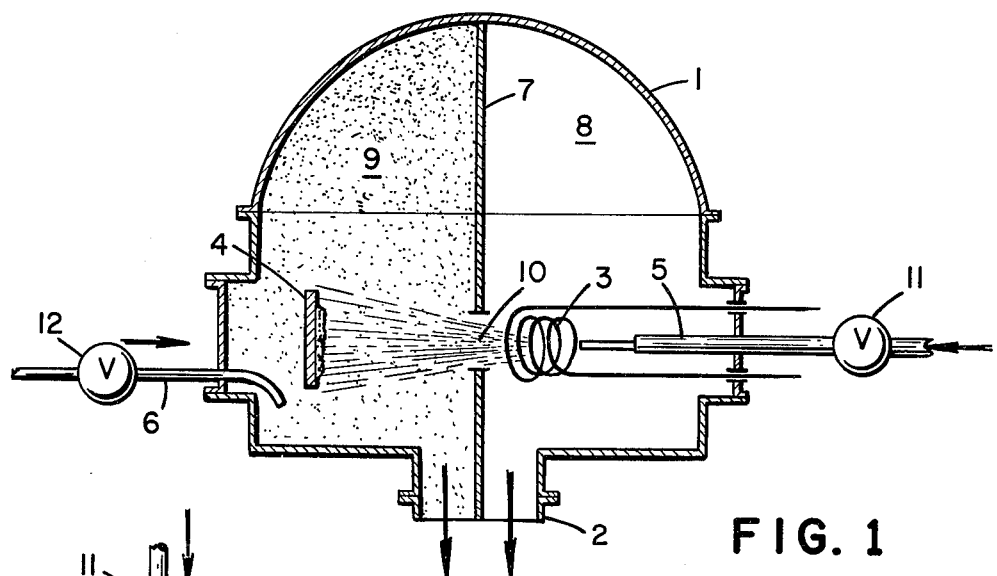
FIG. 1 is a diagrammatic longitudinal section of an embodiment of the apparatus and FIGS. 2, 3, 4 and 5 are diagrammatic longitudinal sections of variants of the embodiment of the apparatus of FIG. 1.

Orifice 10, like other orifices not shown in the cross-section in FIG. 1, is positioned so that each orifice is disposed with respect to one substrate (such as substrate 4) on the straight path of the sprayed particles emitted by coil 3 under the action of the inert gas ejected by duct 5 and by the electromagnetic field produced by coil 3.

Wall 7 separates coil 3 and the inert gas supply 5 in chamber 8 from substrate 4 and the reactive gas supply 6, which are confined in chamber 9.

The conductive material or conductive-material component forming coil 3 is sprayed in chamber 8; the finely divided sprayed material from the coil travels through orifices 10 into chamber 9 towards substrates 4, which are immersed in the reactive gas ejected by supply ducts 6; the particles then make contact with the reactive gas and react therewith to form a compound which is deposited in a thin layer on substrates 4.

The thin layer of the resulting compound can be formed in a manner different from that described, i.e. by a combination reaction between the fine particles of sprayed material during that part of their journey between coil 3 and substrate 4 which occurs in chamber 9 and/or by a combination reaction with the reactive gas after deposition on substrate 4.

The flow rate of gas in chambers 8 and 9 is adjusted by calibrated valves 11, 12 disposed on the supply ducts, i.e. duct 5 and duct 6 respectively.

In order to prevent contamination of coil 3, i.e. the formation of an insulating layer on the surface of coil 3 so as to interfere with spraying, chambers 8 and 9 are individually connected to the vacuum generation system, as illustrated in FIG. 1 where the connection 2 is doubled and thus prevents any return of the reactive gas from chamber 9 to chamber 8.

Referring to FIGS. 2, 3, 4 and 5, where like references denote parts corresponding to those in FIG. 1, FIGS. 2 to 5 illustrate variants of the apparatus.

Figure 2:
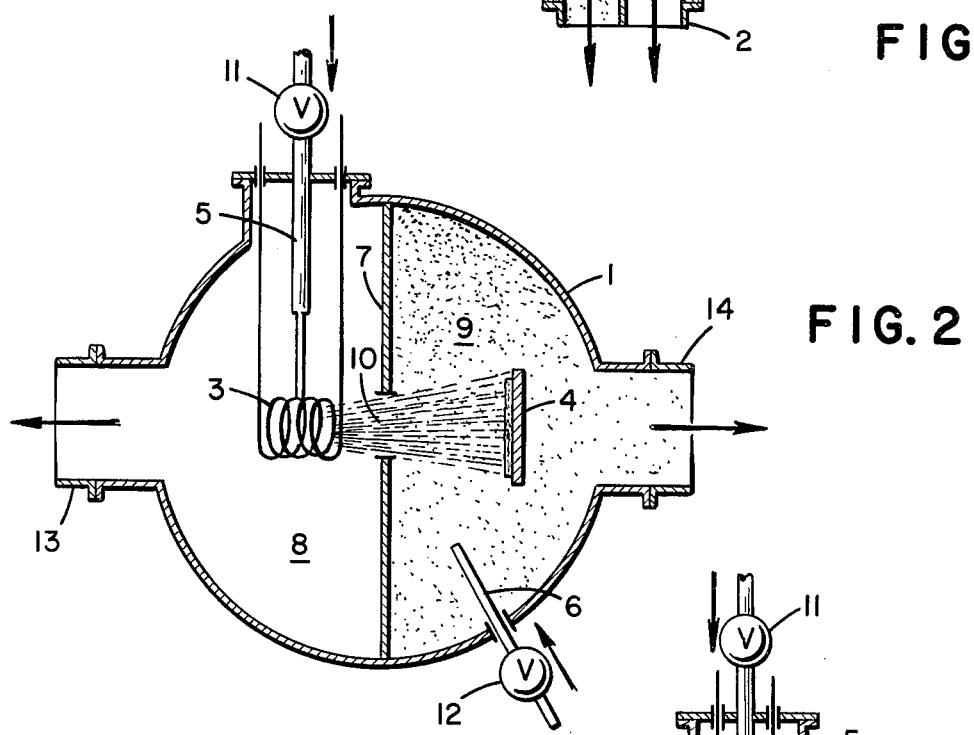

The embodiment in FIG. 2 differs from that in FIG. 1 in that each chamber 8 and 9, instead of comprising a double connection to the vacuum generation system similar to connection 2 in FIG. 1, has an individual connection 13, 14 respectively disposed on the longitudinal axis of coil 3.

Figure 3:
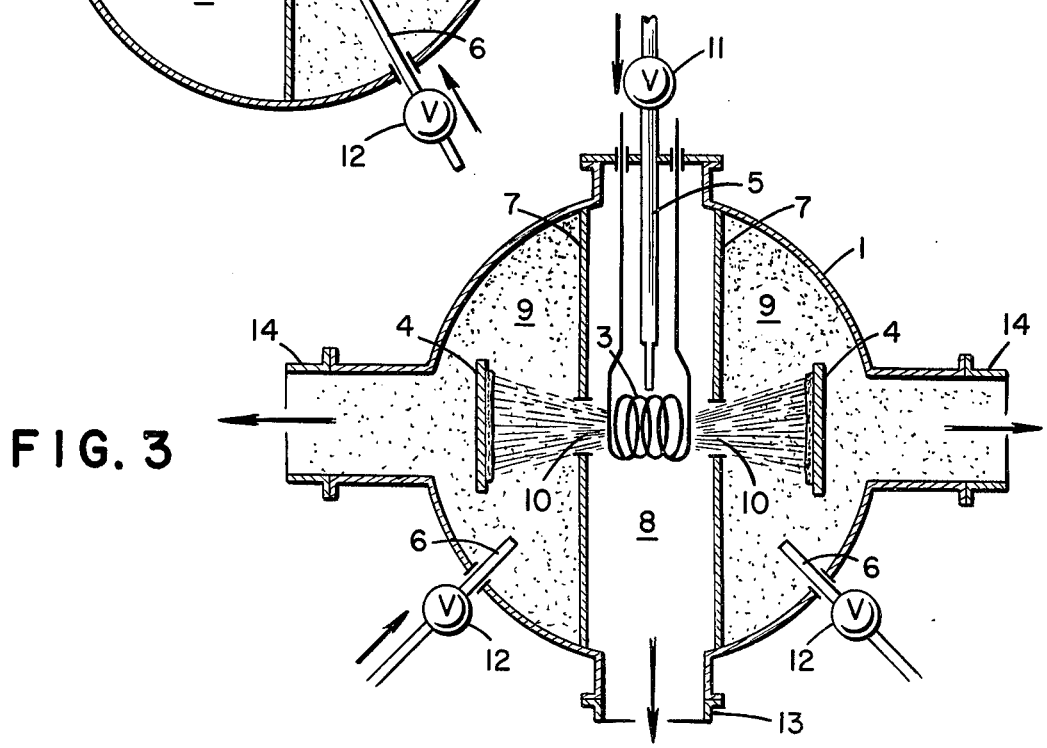
Figure 4:
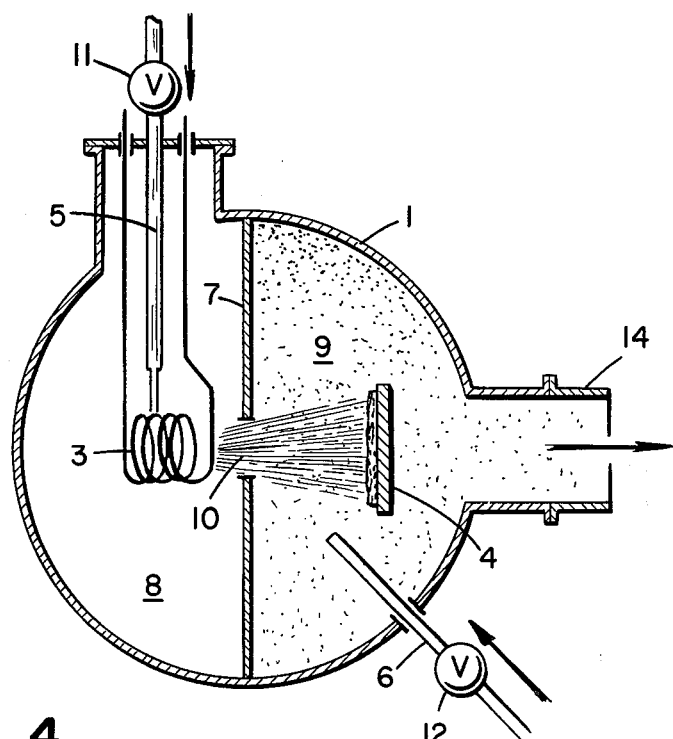

FIG. 4 illustrates a variant of the embodiment illustrated in FIG. 2, which is identical with FIG. 2 except that chamber 9 is provided with a connection 15 to the vacuum generation system. FIG. 3 illustrates another variant of the apparatus and differs from the variants illustrated in FIGS. 1, 2 and 4 in that the single wall is replaced by two walls 7 which together bound a chamber 8 and at least two chambers 9 outside chamber 8.

In the same manner as in FIG. 2, each chamber 8, 9 has an individual connection 13, 14 respectively for the vacuum generation system.

Figure 5:
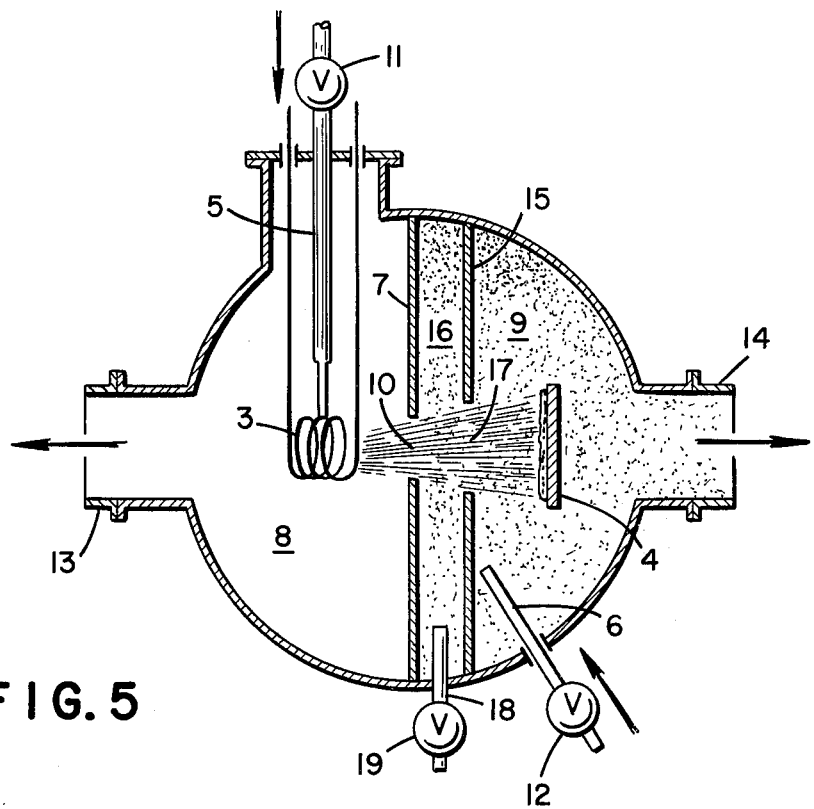

In FIG. 5, a wall 15 disposed inside chamber 9 bounds an intermediate chamber 16 between chambers 8 and chamber 9 containing substrate 4. Chamber 16 has an orifice 17 corresponding to orifice 10 in wall 7 and is supplied by a supply duct 18 via a valve 19 with a reactive gas which is either different from the gas injected into chamber 9 via duct 6 or is the same but in different proportions.

The operating pressures of the gases in the respective chambers, which are at approximately $10^{-3}$ Torr, are balanced by suitably proportioning the flow rate of the gases.

The invention may be used to obtain numerous kinds of deposits, such as (through not exclusively) oxides of aluminium, titanium, tungsten and molybdenum and nitrides of tantalum.

The formation rate of an aluminium oxide layer, for a device having a given shape, was found equal to 230 Angstrom units per minute. Other things being equal, inter alia the distance between coil 3 and substrate 4, the deposition rate was found equal to 220 Angstrom units per minute for aluminium. Note that the tests mentioned here refer only to a comparison between the deposition rates of a material from coil 3 and of a compound thereof, but do not relate to the maximum deposition rate, which may be greater.

In addition, the invention may be used to form alternately mixed compounds by changing the reactive gas in the chamber or chambers 9 and/or 16, and for depositing sub-stoichiometric compounds. This may be done simply by suitably proportioning the flow rate of the reactive gas or gases. Valves 12 and/or 19 can be automatically or manually opened and closed by a suitable device, according to a set program if required. According to the program, the reactive gases, which may be the same or different, may be injected into chambers 9 (and into chambers 16 if required) at alternate flow rates or flow rates which are interrupted or modulated depending on the nature of the desired deposit.

The invention has been described with reference to particular embodiments, but of course is not limited thereto and may be varied and modified without departing from its scope.

Thus, with reference to FIG. 3 for example, chamber 8 may be formed not by two walls 7 but by a cylindrical wall defining an inner chamber 8 and a coaxial outer chamber 9.

Similarly, circular or polygonal orifices 10, 17 may be replaced by slots.

In the case where wall 7 in FIG. 3 represents a cylindrical wall in cross-section, the aperture connecting the coaxial chambers 8, 9 may be a slot round the entire perimeter of the cylindrical wall.

I claim:

1. An apparatus for depositing thin layers by reactive spraying a high frequency inductive plasma comprising a sealing-tight vessel connected to a vacuum generation system containing means which are adapted to produce a high-frequency electromagnetic field and comprise a material which can be sprayed by the field, at least one surface serving as a substrate for the thin layer deposition, means for injecting gas into the vessel near the surface and means for injecting a gas into the vessel near the means applying the electromagnetic field, the gases comprising a reactive gas and an inert gas which can be ionized by the electromagnetic field, said vessel comprising partition means dividing it into a first chamber which contains the means applying the electromagnetic field and is connected to the means supplying an ionizable inert gas and at least a second chamber which contains the substrate or substrates and is connected to the means for supplying reactive gas, the partition means being formed with an aperture which connects the chambers and is disposed on the straight path between the substrates and the means for applying the electromagnetic field, the vessel being provided with connecting ducts to the vacuum generation system, the ducts being so disposed with respect to the chambers that the reactive gas cannot flow into the first chamber.

2. An apparatus according to claim 1, wherein the partition means comprises a wall disposed between the substrate or substrates and the means for applying the electromagnetic field.

3. An apparatus according to claim 1, wherein the partition means comprises two walls which together bound the chamber containing the means for applying the electromagnetic field.

4. An apparatus according to claim 1, wherein the partition means comprises a cylindrical wall enclosing the means for applying the electromagnetic field.

5. An apparatus according to claim 4, wherein the communication aperture is a slot round the entire perimeter of the cylindrical wall.

6. An apparatus according to claim 1 wherein the communication aperture is at least one orifice.

7. An apparatus according to claim 1 additionally comprising an intermediate chamber between the chamber containing the means for applying the electromagnetic field and the chamber containing the substrate or substrates, the intermediate chamber being supplied with a different reactive gas from the chamber or chambers containing the substrates, or with the same gas but in different proportions.

8. An apparatus according to claim 1 wherein only the chamber or chambers containing the substrates are provided with connecting ducts to the vacuum generation system.

9. An apparatus according to claim 1 wherein each chamber of the vessel is connected to the vacuum generation system by an individual connecting duct.

* * * * *